(12) United States Patent
Du et al.

(10) Patent No.: US 11,656,289 B2
(45) Date of Patent: May 23, 2023

(54) METHOD AND APPARATUS FOR CORRECTING STATE OF HEALTH OF BATTERY, MANAGEMENT SYSTEM, AND STORAGE MEDIUM

(71) Applicant: CONTEMPORARY AMPEREX TECHNOLOGY CO., LIMITED, Ningde (CN)

(72) Inventors: Mingshu Du, Ningde (CN); Shichao Li, Ningde (CN); Shenzhi Tang, Ningde (CN); Yanhua Lu, Ningde (CN); Wei Zhang, Ningde (CN)

(73) Assignee: CONTEMPORARY AMPEREX TECHNOLOGY CO., LIMITED, Fujian (CN)

( * ) Notice: Subject to any disclaimer, the term of this patent is extended or adjusted under 35 U.S.C. 154(b) by 324 days.

(21) Appl. No.: 17/123,001

(22) Filed: Dec. 15, 2020

(65) Prior Publication Data
US 2021/0141028 A1 May 13, 2021

Related U.S. Application Data

(63) Continuation of application No. PCT/CN2020/084335, filed on Apr. 11, 2020.

(30) Foreign Application Priority Data

Apr. 25, 2019 (CN) .......................... 201910338521.0

(51) Int. Cl.
*G01R 31/392* (2019.01)
*H02J 7/00* (2006.01)
*G01R 31/36* (2020.01)

(52) U.S. Cl.
CPC ....... *G01R 31/392* (2019.01); *G01R 31/3648* (2013.01); *H02J 7/005* (2020.01); *H02J 7/0049* (2020.01)

(58) Field of Classification Search
CPC .............................. G01R 31/392; H02J 7/005
(Continued)

(56) References Cited

U.S. PATENT DOCUMENTS

| | | | |
|---|---|---|---|
| 2010/0036626 A1* | 2/2010 | Kang | G01R 31/392 702/63 |
| 2013/0229154 A1* | 9/2013 | Benjamin | G01R 31/378 320/132 |

(Continued)

FOREIGN PATENT DOCUMENTS

| | | | |
|---|---|---|---|
| CN | 101946187 A | | 1/2011 |
| CN | 103399278 A | | 11/2013 |

(Continued)

OTHER PUBLICATIONS

Rosca, On-line Parameter, State-of-Charge and Aging Estimation of Li-ion Batteries, 2012 IEEE Vehicle Power and Propulsion Conference, Seoul, South Korea, Oct. 9-12, 2012, 6 pgs.

(Continued)

*Primary Examiner* — Ricky Go
(74) *Attorney, Agent, or Firm* — Morgan, Lewis & Bockius LLP

(57) ABSTRACT

This disclosure provides a method and an apparatus for correcting a state of health of a battery, a battery management system, and a storage medium, and relates to the field of battery technologies. The method includes: determining whether a current voltage value of a battery cell is within a correction OCV section of the battery cell; if yes, using the current voltage value of the battery cell as a correction voltage value; and acquiring an SOC correction value, and correcting a state of health (SOH) of the battery cell. According to the method, the apparatus, the battery management system, and the storage medium in this disclosure, reliability of an SOH correction result is improved, thereby providing accurate estimation of the state of health of the (Continued)

battery, a prolonged service life of the battery, and better user experience.

14 Claims, 10 Drawing Sheets

(58) Field of Classification Search
    USPC .......................................................... 702/63
    See application file for complete search history.

(56) References Cited

U.S. PATENT DOCUMENTS

| | | | |
|---|---|---|---|
| 2014/0232411 A1* | 8/2014 | Vaidya | G01R 31/3842 324/426 |
| 2014/0244193 A1 | 8/2014 | Balasingam et al. | |
| 2015/0293183 A1* | 10/2015 | Tenmyo | G01R 31/392 324/429 |
| 2016/0131720 A1* | 5/2016 | Baba | G01R 31/367 702/63 |
| 2018/0313906 A1 | 11/2018 | Takahashi et al. | |

FOREIGN PATENT DOCUMENTS

| | | |
|---|---|---|
| CN | 103616646 A | 3/2014 |
| CN | 104535932 A | 4/2015 |
| CN | 105203963 A | 12/2015 |
| CN | 106324507 A | 1/2017 |
| CN | 107742755 A | 2/2018 |
| CN | 107742855 A | 2/2018 |
| CN | 108061863 A | 5/2018 |
| CN | 108196200 A | 6/2018 |
| CN | 108470944 A | 8/2018 |
| CN | 108761343 A | 11/2018 |
| CN | 109507611 A | 3/2019 |
| CN | 109669133 A | 4/2019 |
| CN | 110988690 A | 4/2020 |
| EP | 2916422 A1 | 9/2015 |
| EP | 3413067 A1 | 12/2018 |
| WO | WO 2006/096002 A1 | 9/2006 |
| WO | WO 2015/158813 A1 | 10/2015 |

OTHER PUBLICATIONS

Macicior, Iterative Capacity Estimation of LiFePO4 Cell Over the Lifecycle Based on SoC Estimation Correction, EVS27 International Battery, Hybrid and Fuel Cell Electric Vehicle Symposium, Barcelona, Spain, Nov. 17-20, 2013, 10 pgs.
Bao Hui, State of Charge Estimation Error Correction of Open Circuit Voltage Method, Journal of Civil Aviation Flight University of China, vol. 25 No. 5, Sep. 2014, 5 pgs.
Han, Characteristics Analysis of Open Circuit Voltage of Aged LiFePO4 Battery for Electric Vehicle, vol. 39, No. 9, Sep. 2015, 4 pgs.
Zhu, A New Model of Jointed States of Charge and Health for Lithium Batteries, Proceedings of the CSEE, Jun. 2018, 2 pgs.
Shi, Capacity Fading and Degradation Mechanism of A123 Battery, Power System Technology, vol. 39, No. 4, Apr. 2015, 6 pgs.
Baronti, Hysteresis Modeling in Li-Ion Batteries, IEEE Transactions on Magnetics, vol. 50 No. 11, Nov. 2014, 4 pgs.
Roscher, OCV Hystereris in Li-Ion Batteries including Two-Phase Transition Materials, International Journal of Electrochemistry, vol. 2011, Article ID 984320, Feb. 28, 2011, 7 pgs.
Contemporary Amperex Technology Co. Limited, Extended European Search Report, EP20794606-2, dated Jul. 26, 2021, 11 pgs.
Contemporary Amperex Technology Co. Limited, International Search Report and Written Opinion, PCT/CN2020/084335, dated Jul. 17, 2020, 17 pgs.
Contemporary Amperex Technology Co. Limited, First Office Action, CN201910338521.0, dated Jul. 30, 2020, 9 pgs.

* cited by examiner

US 11,656,289 B2

METHOD AND APPARATUS FOR CORRECTING STATE OF HEALTH OF BATTERY, MANAGEMENT SYSTEM, AND STORAGE MEDIUM

CROSS-REFERENCE TO RELATED APPLICATIONS

This application is a continuation application of PCT Patent Application No. PCT/CN2020/084335, entitled "METHOD AND APPARATUS FOR CORRECTING STATE OF HEALTH OF BATTERY, AND MANAGEMENT SYSTEM AND STORAGE MEDIUM" filed on Apr. 11, 2020, which claims priority to Chinese Patent Application No. CN201910338521.0, filed with the State Intellectual Property Office of the People's Republic of China on Apr. 25, 2019, and entitled "METHOD AND APPARATUS FOR CORRECTING STATE OF HEALTH OF BATTERY, MANAGEMENT SYSTEM, AND STORAGE MEDIUM", all of which are incorporated herein by reference in their entirety.

TECHNICAL FIELD

This disclosure relates to the field of battery technologies, and in particular, to a method and an apparatus for correcting a state of health of a battery, a battery management system, and a storage medium.

BACKGROUND

A state of health (SOH) is an important parameter reflecting performance and a service life of a battery. The state of health (SOH) of a battery typically refers to a ratio of a capacity of the battery after aging to a capacity of a new battery cell. Batteries inevitably age or deteriorate during long-term use, resulting in a significant decrease in a battery capacity. If the SOH is not corrected after the battery capacity is attenuated, calculation a state of charge (SOC) of the battery may encounter a greater error. In addition, during charging with a same charge current, an actual rate is also higher, resulting in problems such as an overcurrent risk.

Currently, a method commonly used for detecting an SOH of a battery is to acquire an SOC based on an open-circuit voltage (OCV)-SOC curve through table look-up, calculate a cumulative charge and discharge capacity, estimate an actual capacity of a battery cell, and then estimate the SOH. However, when the OCV-SOC curve changes with aging of the battery, the estimated SOC has a relatively large error, causing inaccuracy of the estimated SOH, and relatively low reliability in correcting the SOH. In addition, some batteries have a hysteresis effect (that is, a charge OCV and a discharge OCV are inconsistent), and the OCV-SOC curve also changes under different historical operating conditions. This also results in a relatively large error of the estimated SOC, causing inaccuracy of the estimated SOH, and relatively low reliability in correcting the SOH.

SUMMARY

In view of this, a technical issue to be addressed in this disclosure is to provide a method and an apparatus for correcting a state of health of a battery, a battery management system, and a storage medium.

According to an aspect of this disclosure, a method for correcting a state of health of a battery is provided, including: acquiring a first current voltage value V0 of a battery cell; when V0 is within a correction open-circuit voltage (OCV) section of the battery cell, acquiring a first state of charge (SOC) SOC0 and a first cumulative charge and discharge capacity Q0 corresponding to V0, wherein the correction OCV section comprises at least one of a non-attenuation OCV section and a non-hysteresis OCV section, an OCV of the battery cell is unaffected by battery aging in the non-attenuation OCV section, and an OCV of the battery cell is unaffected by a hysteresis effect in the non-hysteresis OCV section; acquiring a second current voltage value V1 of the battery cell; when V1 is within the correction OCV section of the battery cell, acquiring a second state of charge SOC1 and a second cumulative charge and discharge capacity Q1 corresponding to V1; acquiring a current SOH correction value of the battery cell based on a ratio of a variation between Q0 and Q1 to a variation between SOC0 and SOC1; and updating an SOH output value of the battery cell by using the current SOH correction value of the battery cell.

In an embodiment, it is determined whether a battery standing condition is satisfied; and if satisfied, it is determined whether the current voltage value of the battery cell is within the correction OCV section.

In an embodiment, a correction OCV section corresponding to the battery cell is determined based on OCV-SOC mapping relationship information of the battery cell.

In an embodiment, the determining, based on OCV-SOC mapping relationship information of the battery cell, a correction OCV section corresponding to the battery cell includes: determining, based on the OCV-SOC mapping relationship information, an OCV value corresponding to a correction zone of the battery cell, where the correction zone includes at least one of a non-attenuation zone and a non-hysteresis zone; and generating, based on the OCV value, a correction OCV section corresponding to the correction zone.

In an embodiment, the determining, based on the OCV-SOC mapping relationship information, an OCV value corresponding to a correction zone of the battery cell includes: pre-acquiring a plurality of pieces of first OCV-SOC mapping relationship information of the battery cell at different degrees of aging, to determine a first OCV value interval; acquiring first OCV detection values within the first OCV value interval by using a preset first OCV gap as a spacing; and acquiring, based on the plurality of pieces of first OCV-SOC mapping relationship information, a plurality of first SOC values corresponding to the first OCV detection values, and if a difference between a largest value and a smallest value of the plurality of first SOC values is less than a first difference threshold, using the first OCV detection values as non-attenuation OCV values corresponding to the non-attenuation zone.

In an embodiment, the generating, based on the OCV value, a correction OCV section corresponding to the correction zone includes: determining whether a difference between two adjacent non-attenuation OCV values is greater than the first OCV gap, and if not, using an OCV zone between the two adjacent non-attenuation OCV values as a non-attenuation OCV segment, where the non-attenuation OCV section includes at least one non-attenuation OCV segment.

In an embodiment, the determining, based on the OCV-SOC mapping relationship information, an OCV value corresponding to a correction zone of the battery cell includes: pre-acquiring at least one piece of second OCV-SOC mapping relationship information for charging of the battery cell starting at different states of charge, and at least one piece of third OCV-SOC mapping relationship information for discharging of the battery cell starting at different states of charge, and determining a second OCV value interval; acquiring second OCV detection values within the second OCV value interval by using a preset second OCV gap as a spacing; and acquiring, based on the at least one piece of second OCV-SOC mapping relationship information and the at least one piece of third OCV-SOC mapping relationship information, a plurality of second SOC values corresponding to the second OCV detection values, and if a difference between a largest value and a smallest value of the plurality of second SOC values is less than a second difference threshold, using the second OCV detection values as non-hysteresis OCV values corresponding to the non-hysteresis zone.

In an embodiment, the generating, based on the OCV value, a correction OCV section corresponding to the correction zone includes: determining whether a difference between two adjacent non-hysteresis OCV values is greater than the second OCV gap, and if not, using an OCV zone between the two adjacent non-hysteresis OCV values as a non-hysteresis voltage segment, where the non-hysteresis OCV section includes at least one non-hysteresis voltage segment.

In an embodiment, the correction voltage value includes at least two first current voltage values of the battery cell within the non-attenuation OCV section and/or the non-hysteresis OCV section; and the correcting a state of health (SOH) of the battery cell includes: acquiring, based on current fourth OCV-SOC mapping relationship information, first SOC correction values corresponding to the first current voltage values; acquiring a first SOC variation between the two first SOC correction values, and a first cumulative charge and discharge capacity variation of the battery cell that corresponds to the first SOC variation; and acquiring an SOH correction value based on the first cumulative charge and discharge capacity variation and the first SOC variation.

In an embodiment, the acquiring an SOH correction value based on the first cumulative charge and discharge capacity variation and the first SOC variation includes: using a ratio of the first cumulative charge and discharge capacity variation to the first SOC variation as an actual capacity of the battery cell, and using a ratio of the actual capacity to a nominal capacity as the SOH correction value.

In an embodiment, the correction voltage value includes a second current voltage value of the battery cell within the non-attenuation OCV section and/or the non-hysteresis OCV section; and the correcting a state of health (SOH) of the battery cell includes: acquiring, based on current fourth OCV-SOC mapping relationship information, a second SOC correction value corresponding to the second current voltage value; when the battery cell is in a fully charged state or when a full-charge signal is received, acquiring a first SOC full-charge value, and acquiring a first full-charge cumulative charge and discharge capacity corresponding to the first SOC full-charge value; acquiring a second SOC variation between the first SOC full-charge value and the second SOC correction value, and a second cumulative charge and discharge capacity variation between the first full-charge cumulative charge and discharge capacity and a second cumulative charge and discharge capacity; and acquiring an SOH correction value based on the second cumulative charge and discharge capacity variation and the second SOC variation.

In an embodiment, the acquiring an SOH correction value based on the second cumulative charge and discharge capacity variation and the second SOC variation includes: using a ratio of the second cumulative charge and discharge capacity variation to the second SOC variation as an actual capacity of the battery cell, and using a ratio of the actual capacity to a nominal capacity as the SOH correction value.

In an embodiment, before the battery cell is in the fully charged state or before the full-charge signal is received, if a plurality of second current voltage values are acquired, a plurality of SOC correction values corresponding to the plurality of second current voltage values are acquired based on the fourth OCV-SOC mapping relationship information, and a smallest SOC correction value in the plurality of SOC correction values is used as the second SOC correction value.

In an embodiment, the correction voltage value includes a third current voltage value of the battery cell within the non-attenuation OCV section and/or the non-hysteresis OCV section; and the correcting a state of health (SOH) of the battery cell includes: acquiring, based on current fourth OCV-SOC mapping relationship information, a third SOC correction value corresponding to the third current voltage value, and acquiring a third cumulative charge and discharge capacity corresponding to the third SOC correction value; when the battery cell is in a fully charged state or when a full-charge signal is received, acquiring a second SOC full-charge value, and acquiring a second full-charge cumulative charge and discharge capacity corresponding to the second SOC full-charge value; performing linear fitting processing based on a correspondence between the third cumulative charge and discharge capacity and the third SOC correction value, and a correspondence between the second full-charge cumulative charge and discharge capacity and the second SOC full-charge value, to establish a linear relationship function between a cumulative charge and discharge capacity and an SOC value, and acquiring an SOH correction value based on the linear relationship function.

In an embodiment, if a sum of a quantity of third SOC correction values and a quantity of second SOC full-charge values is equal to a preset quantity threshold, the linear fitting processing is performed, where an algorithm used for performing the linear fitting processing includes a least square method.

In an embodiment, the acquiring an SOH correction value based on the linear relationship function includes: acquiring a fitting error of the linear relationship function; and if it is determined that the fitting error is less than a preset error threshold, acquiring a slope corresponding to the linear relationship function, and using the slope as the SOH correction value.

In an embodiment, the battery standing condition includes at least one of the following: duration in which an external circuit of the battery cell has no current exceeds a preset time threshold, and a voltage change rate of the battery cell is less than a preset rate change threshold.

According to another aspect of this disclosure, an apparatus for correcting a state of health of a battery is provided, including: a correction occasion judgment module, configured to determine whether a current voltage value of a battery cell is within a correction OCV section of the battery cell, where the correction OCV section includes at least one of a non-attenuation OCV section and a non-hysteresis OCV section; and a state of health correction module, configured to: if the current voltage value of the battery cell is within the correction OCV section, use the current voltage value of the battery cell as a correction voltage value, acquire an SOC correction value corresponding to the correction voltage value, and correct a state of health (SOH) of the battery cell by using the SOC correction value.

In an embodiment, the apparatus further includes a correction zone determining module, configured to determine, based on OCV-SOC mapping relationship information of the battery cell, a correction OCV section corresponding to the battery cell.

According to still another aspect of this disclosure, an apparatus for correcting a state of health of a battery is provided, including: a memory, and a processor coupled to the memory, where the processor is configured to execute the foregoing method according to an instruction stored in the memory.

According to still another aspect of this disclosure, a battery management system is provided, including the foregoing apparatus for correcting a state of health of a battery.

According to yet another aspect of this disclosure, a non-transitory computer readable storage medium, wherein the computer readable storage medium stores a computer instruction, and the instruction is executed by a processor to implement the foregoing method.

According to the method and the apparatus for correcting a state of health of a battery, the battery management system, and the storage medium in this disclosure, the correction OCV section is determined; if the current voltage value of the battery cell is within the correction OCV section, the current voltage value is used as the correction voltage value; the SOC correction value is acquired, and the SOH is corrected by using the SOC correction value. In this disclosure, for phenomena of battery aging and a hysteresis effect of battery charging and discharging, when a voltage value of the battery cell is within the correction OCV section, different OCV-SOC curves change essentially the same, and an SOC is acquired and an SOH is corrected essentially free from impact of a hysteresis effect or impact of an aging change of the battery. In this disclosure, when the battery cell is within a non-hysteresis zone or a non-attenuation zone, an SOC can be acquired, and an SOH can be corrected. This could overcome a problem of low accuracy in acquiring an SOC and correcting an SOH under impact of battery aging and a hysteresis effect of battery charging and discharging, thereby improving reliability of an SOH correction result, allowing accurate estimation of the state of health of the battery, a prolonged service life and enhanced safety of the battery, and better user experience.

BRIEF DESCRIPTION OF DRAWINGS

To describe the technical solutions in the embodiments of this disclosure or in the prior art more clearly, the following briefly describes the accompanying drawings required for describing the embodiments or the prior art. Apparently, the accompanying drawings in the following description show merely some embodiments of this disclosure, and a person of ordinary skill in the art may still derive other drawings from these accompanying drawings without creative efforts.

DESCRIPTION OF EMBODIMENTS

The following describes this disclosure more comprehensively with reference to the accompanying drawings, where example embodiments of this disclosure are described. The following clearly and completely describes the technical solutions in the embodiments of this disclosure with reference to the accompanying drawings in the embodiments of this disclosure. Apparently, the described embodiments are merely some but not all of the embodiments of this disclosure. All other embodiments acquired by a person of ordinary skill in the art based on the embodiments of this disclosure without creative efforts fall within the protection scope of this disclosure. The following describes the technical solutions in this disclosure in various aspects with reference to various drawings and embodiments.

"First", "second", and the like in the following description are merely intended for differentiation in description, and have no other special meanings.

For a hybrid-system battery cell, a silicon-anode-system battery cell, or the like, an OCV-SOC curve changes as the battery cell ages. For a lithium-iron-phosphate battery cell, a silicon anode system battery cell, or the like, there is a hysteresis effect of inconsistency between a charging OCV and a discharging OCV, and an OCV-SOC curve under charging and discharging conditions also changes accordingly. Therefore, there may be a relatively large error for estimating an SOC and estimating an SOH based on the OCV-SOC curve.

Results and analysis of battery cell test data indicate that, for an aging phenomenon of a battery, a change of an OCV-SOC curve does not occur in all SOC intervals, that is, during aging of the battery, there is a non-attenuation zone in which an OCV is not affected by the aging of the battery, where this zone may also be referred to as an SOC non-attenuation zone; for a hysteresis effect of battery charging and discharging, a change of an OCV-SOC curve does not occur in all SOC intervals either, that is, there is a non-hysteresis zone in which an OCV is not affected by the hysteresis effect, where this zone may be referred to as an SOC non-hysteresis zone.

This disclosure provides a method for correcting a state of health of a battery. A correction OCV section of a battery cell is determined, and an OCV within the correction OCV section is not affected by a hysteresis effect or affected by an aging change of the battery. That is, for these two phenomena, the battery aging and the hysteresis effect of battery charging and discharging, different OCV-SOC curves change essentially the same within the correction OCV section. When a current voltage value of the battery cell is within the correction OCV section, an SOC and an SOH are estimated, so as to improve reliability.

Figure 1:
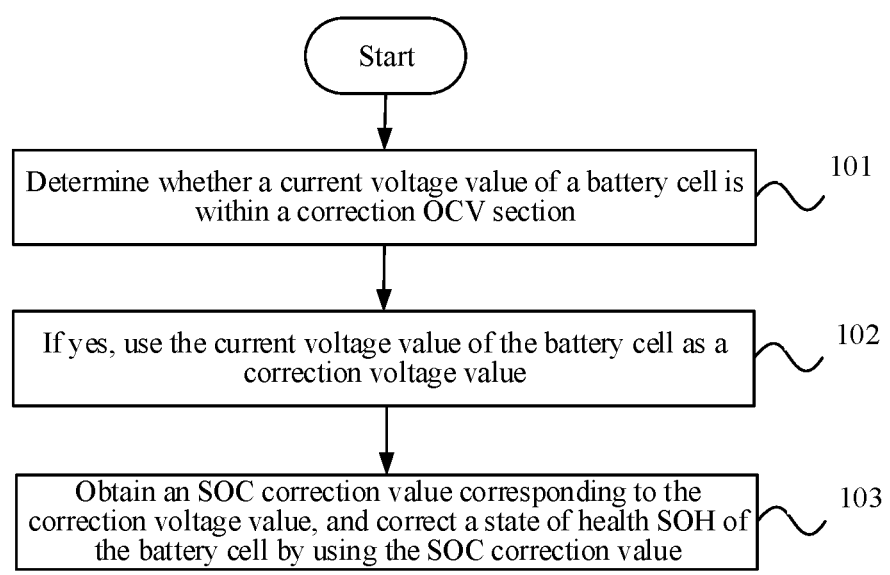
FIG. 1 is a schematic flowchart of an embodiment of a method for correcting a state of health of a battery according to this disclosure.

FIG. 1 is a schematic flowchart of an embodiment of a method for correcting a state of health of a battery according to this disclosure. As shown in FIG. 1:

Step 101. Determine whether a current voltage value of a battery cell is within a correction OCV section.

The battery cell is a battery cell of a lithium battery, or the like. A correction OCV section corresponding to the battery cell may be determined based on OCV-SOC mapping relationship information of the battery cell. There may be a plurality of types of OCV-SOC mapping relationship information. For example, the OCV-SOC mapping relationship information may be an OCV-SOC curve or an OCV-SOC mapping relationship table.

The correction OCV section includes at least one of a non-attenuation OCV section and a non-hysteresis OCV section. The non-attenuation OCV section is an OCV value range corresponding to a non-attenuation zone of the battery cell, and the non-hysteresis OCV section is an OCV value range corresponding to a non-hysteresis zone of the battery cell.

The current voltage value of the battery cell may be acquired in a plurality of manners. For example, a voltage value may be acquired through detection, or a voltage characteristic value may be estimated by using a voltage estimation model. Whether the current voltage value is within the correction OCV section may be determined in a plurality of scenarios, for example, during charging or discharging, or when the battery cell resumes operating after a continuous period of no load.

Step 102. If yes, use the current voltage value of the battery cell as a correction voltage value.

Step 103. Acquire an SOC correction value corresponding to the correction voltage value, and correct a state of health (SOH) of the battery cell by using the SOC correction value.

The SOC correction value corresponding to the correction voltage value may be acquired in a plurality of manners. For example, the SOC correction value corresponding to the correction voltage value may be acquired by using an OCV-SOC curve or an OCV-SOC mapping relationship table. A plurality of methods may be used for correcting the state of health (SOH) of the battery cell by using the SOC correction value. The SOC correction value is an SOC value corresponding to the correction voltage value.

The method for correcting a state of health of a battery in the foregoing embodiment overcomes a problem of low accuracy in acquiring an SOC and correcting an SOH under battery aging and a hysteresis effect of battery charging and discharging, so that when the current voltage value of the battery cell is within the correction OCV section, an SOC and an SOH are estimated, thereby improving reliability of an SOH correction result.

In an embodiment, during charging or discharging of the battery cell, or when the battery cell resumes operating after standing for a period of time without load (for example, a vehicle is restarted after stopping for a period of time), it may be determined whether a battery standing condition is satisfied; and if yes, it is determined whether the current voltage value of the battery cell is within the correction OCV section. There may be a plurality of battery standing conditions. For example, the battery standing condition includes at least one of the following: duration in which an external circuit of the battery cell has no current or a current in the external circuit is less than a current threshold exceeds a preset time threshold, and a voltage change rate of the battery cell is less than a preset rate change threshold. The current threshold can be 1 ampere or the like.

Figure 2A:
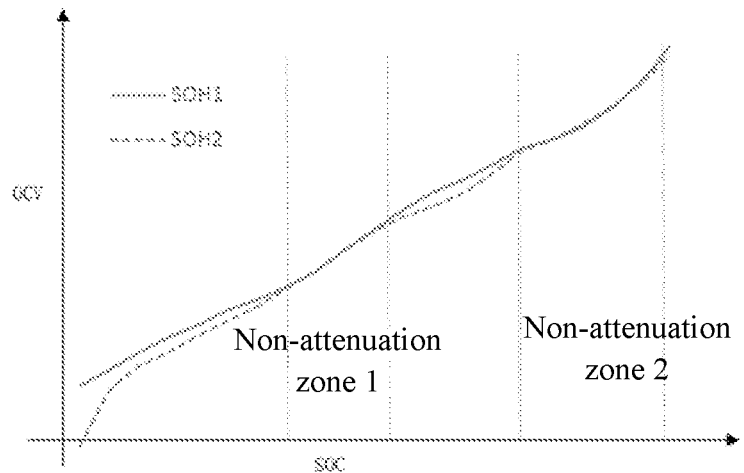
FIG. 2A is a schematic diagram of a change of an OCV-SOC curve before and after aging.
Figure 2B:
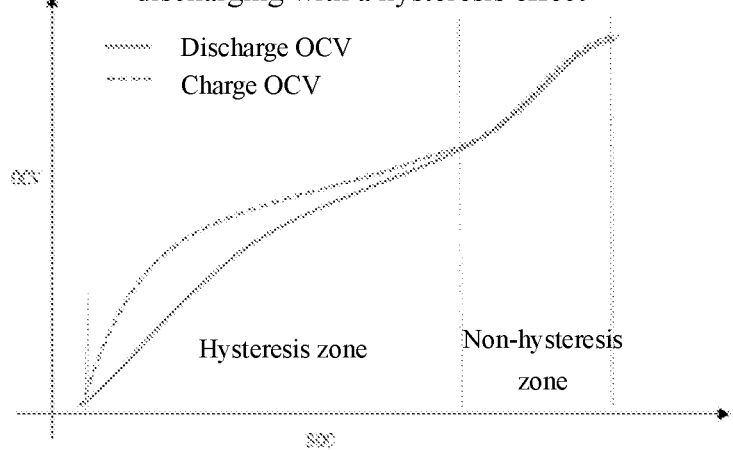
FIG. 2B is a schematic comparison diagram of OCV-SOC curves for charging and discharging of a battery with a hysteresis effect.

The time threshold may be determined by using a functional relationship between or a table of a mapping relationship between temperature and an SOC, and a standing time. The external circuit includes a circuit for charging and discharging the battery cell, or the like. When the battery standing condition is satisfied, it is determined whether the battery cell is in the non-attenuation zone or the non-hysteresis zone at this time. If the battery cell is in the non-attenuation zone or the non-hysteresis zone, it is considered that an SOH correction opportunity is satisfied at this time. The non-attenuation zone and the non-hysteresis zone are shown in FIG. 2A and FIG. 2B.

An OCV value corresponding to a correction zone of the battery cell is determined based on the OCV-SOC mapping relationship information. The OCV-SOC mapping relationship information may be a pre-acquired OCV-SOC curve, OCV-SOC mapping relationship table, or the like. A correction OCV section corresponding to the correction zone is generated based on the OCV value. The correction zone includes at least one of a non-attenuation zone and a non-hysteresis zone.

Figure 3:
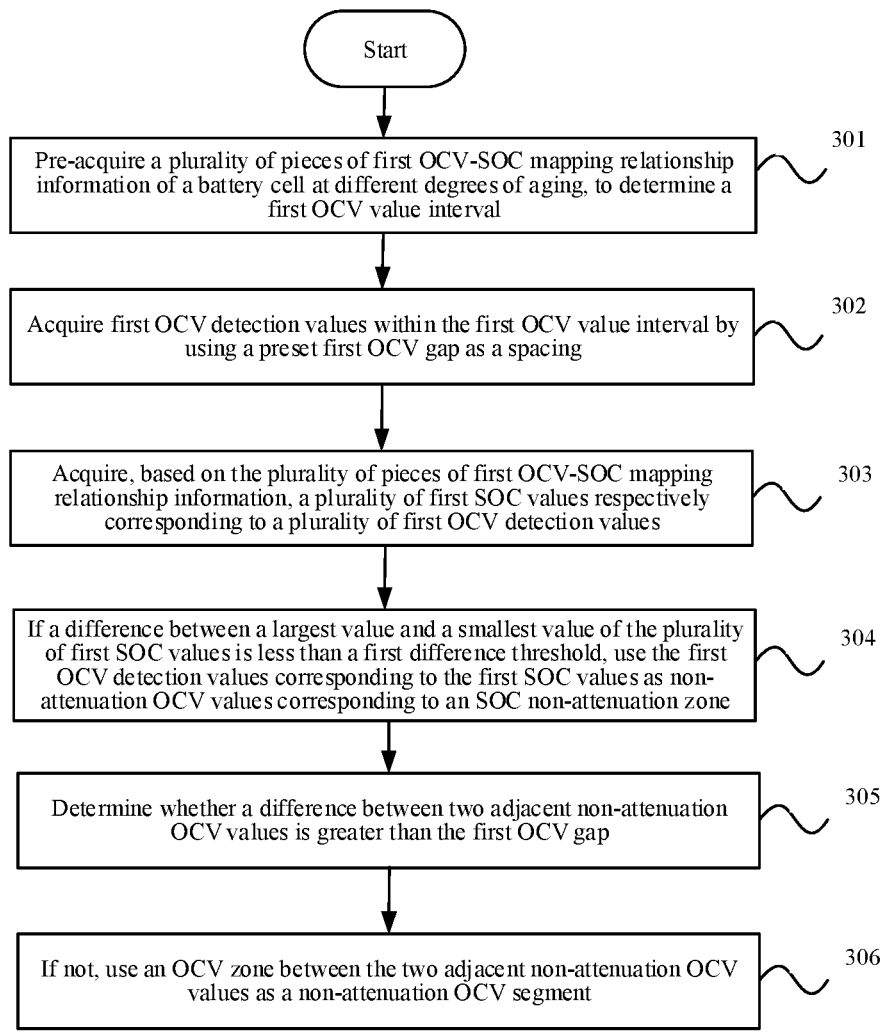
FIG. 3 is a schematic diagram of acquiring a non-attenuation OCV segment in an embodiment of a method for correcting a state of health of a battery according to this disclosure.

FIG. 3 is a schematic diagram of acquiring a non-attenuation OCV segment in an embodiment of a method for correcting a state of health of a battery according to this disclosure. As shown in FIG. 3:

Step 301. Pre-acquire a plurality of pieces of first OCV-SOC mapping relationship information of a battery cell at different degrees of aging, to determine a first OCV value interval.

For example, a plurality of first OCV-SOC mapping relationship tables under different degrees of aging are acquired offline through measurement, and upper and lower limits of an OCV value range are determined by using a maximum OCV value OCVmax and a minimum OCV value OCVmin in the first OCV-SOC mapping relationship tables, to determine the first OCV value interval.

Step 302. Acquire first OCV detection values within the first OCV value interval by using a preset first OCV gap as a spacing.

Step 303. Acquire, based on the plurality of pieces of first OCV-SOC mapping relationship information, a plurality of first SOC values corresponding to the first OCV detection values.

Step 304. If a difference between a largest value and a smallest value of the plurality of first SOC values is less than a first difference threshold, use the first OCV detection values as non-attenuation OCV values corresponding to a non-attenuation zone.

For example, the first OCV detection values are acquired between OCVmax and OCVmin based on first OCV gaps at an equal spacing; the plurality of first SOC values that correspond to the first OCV detection values and that are in the plurality of first OCV-SOC mapping relationship tables are acquired through table look-up; it is determined whether a deviation between the largest value and the smallest value of the plurality of first SOC values is less than the preset first difference threshold; and if the deviation is less than the first difference threshold, the first OCV detection values are used as non-attenuation OCV values and are added to a value list of a non-attenuation zone.

Step 305. Determine whether a difference between two adjacent non-attenuation OCV values is greater than the first OCV gap.

Step 306. If not, use an OCV zone between the two adjacent non-attenuation OCV values as a non-attenuation OCV segment. The non-attenuation OCV section includes at least one non-attenuation OCV segment For example, it is determined whether an OCV difference between two adjacent non-attenuation OCV values in the value list of the non-attenuation zone does not exceed the first OCV gap; and if yes, an OCV zone between the two non-attenuation OCV values may be a non-attenuation OCV segment. The foregoing operation is repeated, so that the non-attenuation OCV section may include all non-attenuation OCV segments.

The plurality of pieces of first OCV-SOC mapping relationship information may be a plurality of OCV-SOC mapping relationship tables for a same type of battery cell. A value of the first OCV gap may be 5 mV, 10 mV, or the like. For example, three first OCV-SOC mapping relationship tables under different degrees of aging are Table A, Table B, and Table C, the first OCV gap is 10 mV, and points are selected between OCVmax=4.1 V and OCVmin=3.4 V based on first OCV gaps at an equal spacing to acquire first OCV detection values: 3.4 V, 3.41 V, 3.42 V, . . . , 4.08 V, 4.09 V, and 4.10 V.

The first OCV detection values are separately used for checking the three first OCV-SOC mapping relationship tables A, B, and C to acquire three different first SOC values. For example, if first SOC values that correspond to 3.5 V and that are in Table A, Table B, and Table C are 20%, 23%, and 21%, a deviation between a largest value and a smallest value of the three first SOC values is |23%−20%|=3%. Assuming that the preset first difference threshold is 5%, because 3%<5%, it is determined that a zone corresponding to 3.5 V is a non-attenuation zone, and 3.5 V is used as a non-attenuation OCV value. If a difference between two adjacent non-attenuation OCV values is not greater than the first OCV gap, an OCV zone between the two adjacent non-attenuation OCV values is used as a non-attenuation OCV segment, and all non-attenuation OCV segments are acquired to constitute a non-attenuation OCV section.

Figure 4:
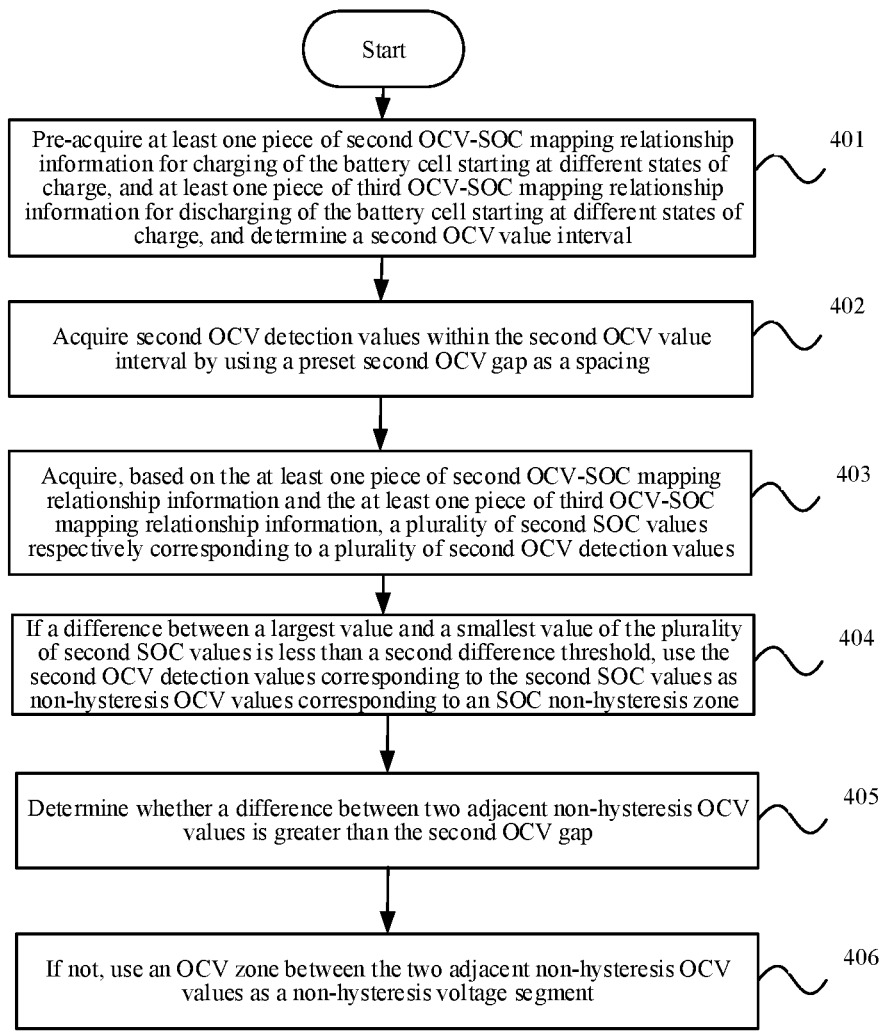
FIG. 4 is a schematic diagram of acquiring a non-hysteresis voltage segment in an embodiment of a method for correcting a state of health of a battery according to this disclosure.

FIG. 4 is a schematic diagram of acquiring a non-hysteresis voltage segment in an embodiment of a method for correcting a state of health of a battery according to this disclosure. As shown in FIG. 4:

Step 401. Pre-acquire at least one piece of second OCV-SOC mapping relationship information for charging of the battery cell starting at different states of charge, and at least one piece of third OCV-SOC mapping relationship information for discharging of the battery cell starting at different states of charge, and determine a second OCV value interval.

For example, offline measurement is performed on a same type of battery cell to acquire at least one second OCV-SOC mapping relationship table for charging at different starting points of states of charge, and at least one third OCV-SOC mapping relationship table for discharging at different starting points of states of charge. Upper and lower limits of an OCV range are determined by using a maximum OCV value OCVmax and a minimum OCV value OCVmin in the second OCV-SOC mapping relationship table and the third OCV-SOC mapping relationship table, to determine the second OCV value interval. A starting point of an SOC for charging may be an SOC of 0%, 10%, 90%, or the like, and a starting point of an SOC for discharging may be an SOC of 10%, 20%, 100%, or the like.

Step 402. Acquire second OCV detection values within the second OCV value interval by using a preset second OCV gap as a spacing.

Step 403. Acquire, based on the at least one piece of second OCV-SOC mapping relationship information and the at least one piece of third OCV-SOC mapping relationship information, a plurality of second SOC values corresponding to the second OCV detection values.

Step 404. If a difference between a largest value and a smallest value of the plurality of second SOC values is less than a second difference threshold, use the second OCV detection values as non-hysteresis OCV values corresponding to a non-hysteresis zone.

For example, the second OCV detection values are acquired between OCVmax and OCVmin based on second OCV gaps at an equal spacing; the plurality of second SOC values that correspond to the second OCV detection values and that are in the at least one second OCV-SOC mapping relationship table and the at least one third OCV-SOC mapping relationship table are acquired through table look-up; it is determined whether a deviation between the largest value and the smallest value of the second SOC values is less than the preset second difference threshold; and if the deviation is less than the second difference threshold, the second OCV detection values are used as non-hysteresis OCV values and are added to a value list of a non-hysteresis zone.

Step 405. Determine whether a difference between two adjacent non-hysteresis OCV values is greater than the second OCV gap.

Step 406. If not, use an OCV zone between the two adjacent non-hysteresis OCV values as a non-hysteresis voltage segment. The non-hysteresis OCV section includes at least one non-hysteresis voltage segment.

For example, it is determined whether an OCV difference between two adjacent non-hysteresis OCV values in the value list of the non-hysteresis zone does not exceed the second OCV gap; and if yes, an OCV zone between the two non-hysteresis OCV values is a non-hysteresis OCV segment. The foregoing operation is repeated to acquire all non-hysteresis OCV segments, so as to constitute the non-hysteresis OCV section.

In an embodiment, two second OCV-SOC mapping relationship tables (under charging conditions) are Table A and Table B, and two third OCV-SOC mapping relationship tables (under discharging conditions) are Table C and Table D. The second OCV gap is 10 mV, and points are selected between OCVmax=4.1 V and OCVmin=3.4 V based on second OCV gaps at an equal spacing to acquire second OCV detection values: 3.4 V, 3.41 V, 3.42 V, . . . , 4.08 V, 4.09 V, and 4.10 V.

The second OCV detection values are used for checking the four mapping relationship tables A, B, C, and D to acquire four second SOC values. For example, second SOC values that correspond to 3.5 V and that are in the four mapping relationship tables A, B, C, and D are 20%, 23%, 24%, and 25%, and a deviation between a largest value and a smallest value of the four second SOC values is |25%−20%|=5%. Assuming that the preset second difference threshold is 5%, because 5%≥5%, it is determined that a zone corresponding to 3.5 V is not a non-hysteresis zone, and 3.5 V is not a non-hysteresis OCV value. If a difference between two adjacent non-hysteresis OCV values is not greater than the second OCV gap, an OCV zone between the two adjacent non-hysteresis OCV values is used as a non-hysteresis OCV segment, and all non-hysteresis OCV segments are acquired to constitute a non-hysteresis OCV section.

In an embodiment, during SOH correction, only a non-attenuation OCV section is used for a hybrid-system battery cell such as an NCM or LMO battery cell; only a non-hysteresis OCV section is used for an LFP battery system and the like; for a silicon-anode-system battery cell, an anode-doped-silicon-system battery cell, or the like, only a non-hysteresis OCV section may be used, or both a non-attenuation OCV section and a non-hysteresis OCV section may be used. NCM is a nickel-cobalt-manganese ternary cathode material, LMO is a lithium manganate cathode material, and LFP is a lithium iron phosphate cathode material.

Figure 5:
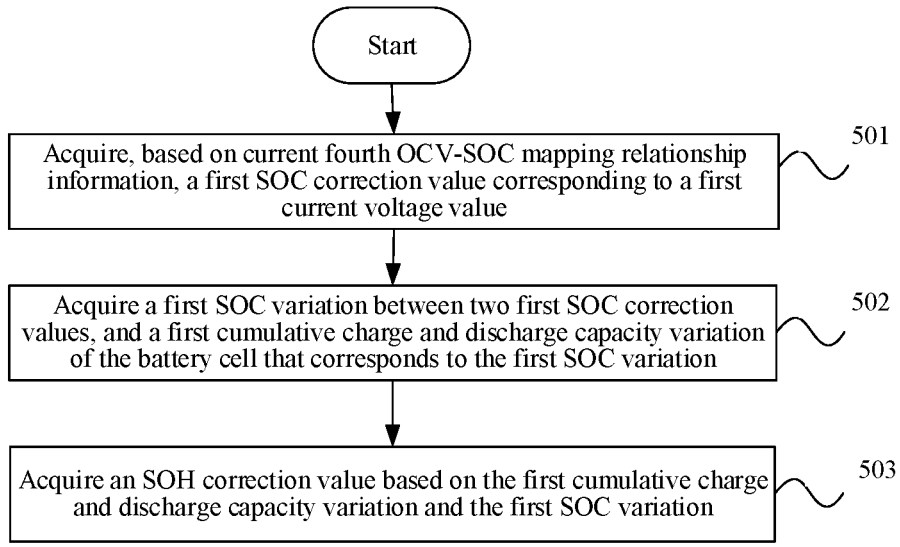
FIG. 5 is a schematic flowchart of acquiring an SOH correction value in another embodiment of a method for correcting a state of health of a battery according to this disclosure.

FIG. 5 is a schematic flowchart of acquiring an SOH correction value in another embodiment of a method for correcting a state of health of a battery according to this disclosure. A correction voltage value includes at least two first current voltage values of a battery cell within a non-attenuation OCV section and/or a non-hysteresis OCV section. As shown in FIG. 5:

Step 501. Acquire, based on current fourth OCV-SOC mapping relationship information, a first SOC correction value corresponding to a first current voltage value.

There may be two or more first current voltage values, and the current fourth OCV-SOC mapping relationship information may be a current OCV-SOC mapping relationship table, or the like. For example, the fourth OCV-SOC mapping relationship information is an OCV-SOC mapping relationship table currently stored in a vehicle.

Step 502. Acquire a first SOC variation between two first SOC correction values, and a first cumulative charge and discharge capacity variation of the battery cell that corresponds to the first SOC variation. A cumulative charge and discharge capacity may be a cumulative charge capacity−a cumulative discharge capacity. The cumulative charge and discharge capacity may be acquired by using a plurality of methods, for example, performing an integral operation on a charge and discharge current function over time to acquire the cumulative charge and discharge capacity.

Step 503. Acquire an SOH correction value based on the first cumulative charge and discharge capacity variation and the first SOC variation.

A plurality of methods may be used for acquiring the SOH correction value based on the first cumulative charge and discharge capacity variation and the first SOC variation. For example, a ratio of the first cumulative charge and discharge capacity variation to the first SOC variation is used as an actual capacity of the battery cell, and a ratio of the actual capacity to a nominal capacity is used as the SOH correction value.

Figure 6:
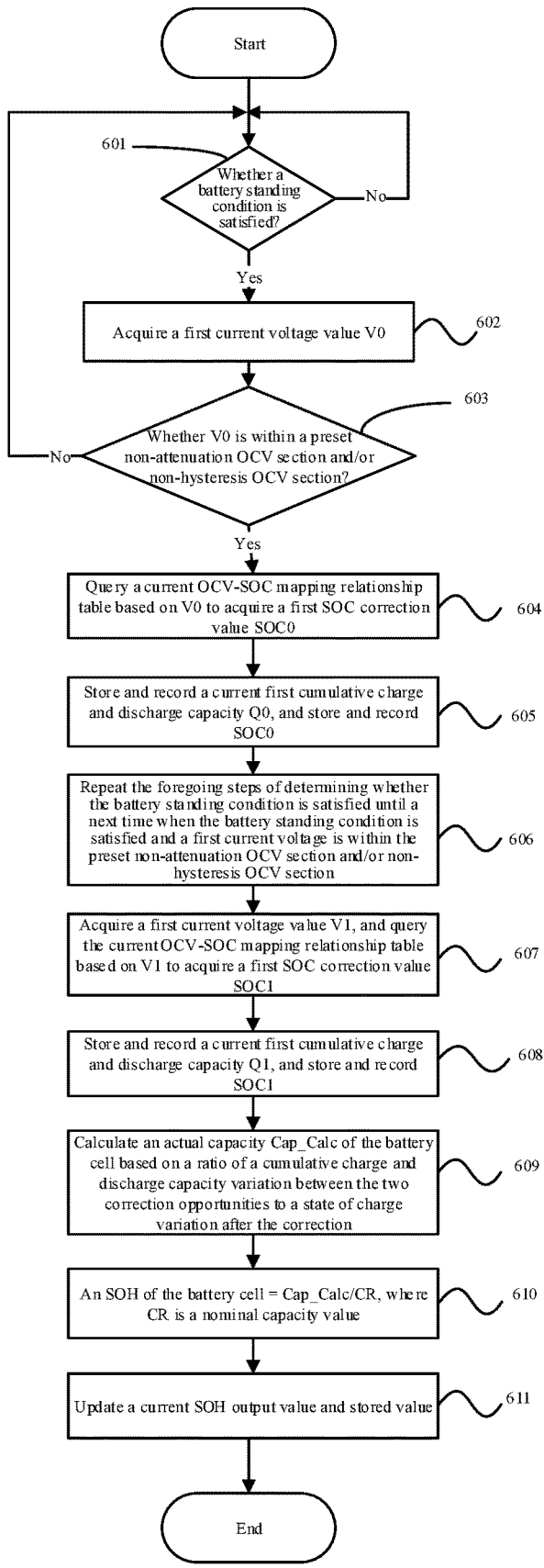
FIG. 6 is a schematic flowchart of acquiring an SOH correction value in another embodiment of a method for correcting a state of health of a battery according to this disclosure.

FIG. 6 is a schematic flowchart of acquiring an SOH correction value in another embodiment of a method for correcting a state of health of a battery according to this disclosure. As shown in FIG. 6:

Step 601. Determine whether a battery standing condition is satisfied; and if yes, go to step 602; or if not, go back.

Step 602. Acquire a first current voltage value V0.

Step 603. Determine whether V0 is within a non-attenuation OCV section and/or a non-hysteresis OCV section; and if yes, determine that a first SOH correction opportunity occurs, and go to step 604; or if not, go back.

Step 604. Query a current OCV-SOC mapping relationship table based on V0 to acquire a first SOC correction value SOC0. The current OCV-SOC mapping relationship table is fourth OCV-SOC mapping relationship information.

Step 605. Store and record a current first cumulative charge and discharge capacity Q0 and SOC0.

Step 606. Repeat steps 601 to 603 until a next time when the battery standing condition is satisfied and a first current voltage is within a preset non-attenuation OCV section and/or non-hysteresis OCV section, and determine that a second SOH correction opportunity occurs.

Step 607. Acquire a first current voltage value V1, and query the current OCV-SOC mapping relationship table based on V1 to acquire a first SOC correction value SOC1.

Step 608. Store and record a current first cumulative charge and discharge capacity Q1 and SOC1.

Step 609. Calculate an actual capacity Cap_Calc of the battery cell based on a ratio of a cumulative charge and discharge capacity variation between the two correction opportunities to a state of charge variation after the correction.

For example, a difference between Q1 and Q0 is 40 Ah, and SOC1 and SOC0 are 80% and 30% respectively. In this case, the actual capacity Cap_Calc of the battery cell is 40 Ah/(80%−30%)=80 Ah.

Step 610. An SOH of the battery cell=Cap_Calc/CR, where CR is a nominal capacity value, and the nominal capacity value may be a standard capacity value preset upon delivery out of a factory.

Step 611. Update a current SOH output value and store the value.

Verification may be performed on the SOH correction value calculated in step 610, and an SOH value successfully verified is updated to a current SOH value and stored. A plurality of verification rules may be used for verifying the SOH correction value. A verification rule may be that an SOH value acquired this time is less than an SOH value acquired last time, or the like. By verifying the SOH correction value and updating only the SOH value successfully verified, inaccurate SOH estimation could be avoided, and accuracy of SOH correction could be improved. For example, when the SOH value calculated last time is 95%, if the SOH correction value calculated this time is 96%, because 96% is greater than 95%, the verification rule is not satisfied, and the correction value is discarded.

A plurality of update rules may be used for updating the current SOH value. An update rule can be that a variation between two continuously acquired SOH values cannot be greater than a specified maximum SOH update value for a single update. By setting the update rule, accuracy of SOH correction could be improved, and reliability of an SOH correction result could be improved. For example, when the SOH value calculated last time is 95%, if the SOH correction value calculated this time is 90%, because 95% is greater than 90%, the verification rule is satisfied; however, a preset maximum SOH update value for a single update is 3%, and because 95%−90%>3%, it is determined that an SOH correction value this time is 95%−3%=92%.

Figure 7:
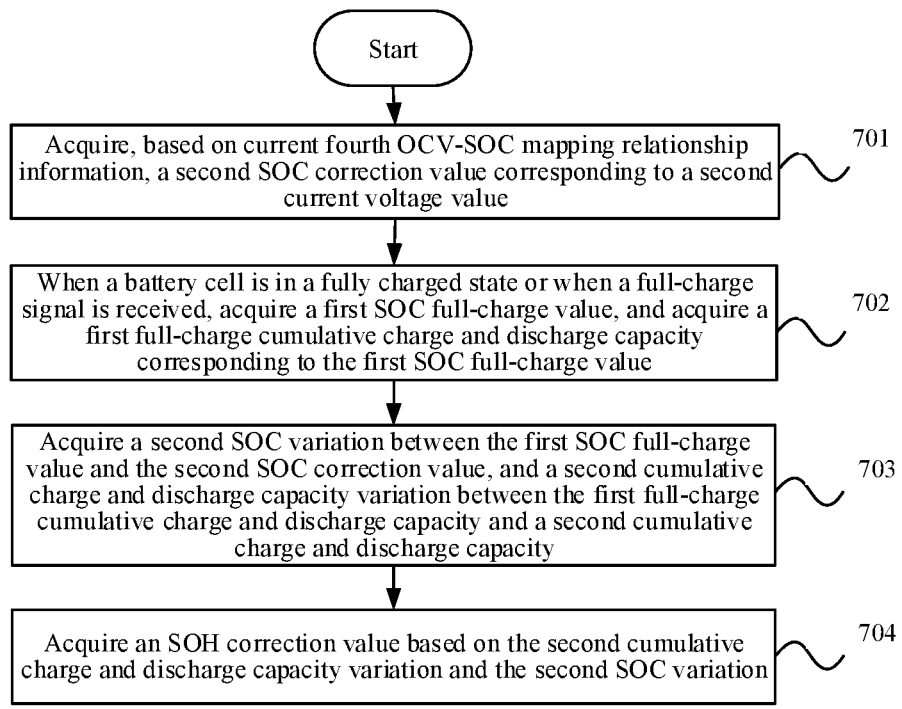
FIG. 7 is a schematic flowchart of acquiring an SOH correction value in still another embodiment of a method for correcting a state of health of a battery according to this disclosure.

FIG. 7 is a schematic flowchart of acquiring an SOH correction value in still another embodiment of a method for correcting a state of health of a battery according to this disclosure. A correction voltage value includes a second current voltage value of a battery cell within a non-attenuation OCV section and/or a non-hysteresis OCV section. As shown in FIG. 7:

Step 701. Acquire, based on current fourth OCV-SOC mapping relationship information, a second SOC correction value corresponding to a second current voltage value.

Step 702. When the battery cell is in a fully charged state or when a full-charge signal is received, acquire a first SOC full-charge value, and acquire a first full-charge cumulative charge and discharge capacity corresponding to the first SOC full-charge value.

It may be determined, according to a charging process, that the battery cell is the fully charged state: When a charge voltage reaches an end-of-charge voltage and duration exceeds a time threshold, it is determined that the battery cell is fully charged; or when a current SOC calculated by an SOC calculation module reaches a preset SOC full-charge threshold, it is determined that the battery cell is fully charged. An SOC full-charge value is an SOC value acquired when the battery cell is in a fully charged state or when a full-charge signal is received.

Step 703. Acquire a second SOC variation between the first SOC full-charge value and the second SOC correction value, and a second cumulative charge and discharge capacity variation between the first full-charge cumulative charge and discharge capacity and a second cumulative charge and discharge capacity.

Step 704. Acquire an SOH correction value based on the second cumulative charge and discharge capacity variation and the second SOC variation.

A plurality of methods may be used for acquiring the SOH correction value based on the second cumulative charge and discharge capacity variation and the second SOC variation. For example, a ratio of the second cumulative charge and discharge capacity variation to the second SOC variation is used as an actual capacity of the battery cell, and a ratio of the actual capacity to a nominal capacity is used as the SOH correction value.

Before the battery cell is in the fully charged state or before the full-charge signal is received, if a plurality of second current voltage values are acquired, a plurality of SOC correction values corresponding to the plurality of second current voltage values are acquired based on the fourth OCV-SOC mapping relationship information, and a correction voltage value corresponding to a smallest SOC correction value in the plurality of SOC correction values is used as the second SOC correction value.

For example, before the battery cell is in the fully charged state or before the full-charge signal is received, after a second current voltage value is acquired, no other second current voltage value is acquired; or after a second current voltage value is acquired, if another second current voltage value is acquired, SOC correction values corresponding to the two second current voltage values are compared, and a second current voltage value corresponding to a smaller SOC correction value is stored.

Figure 8:
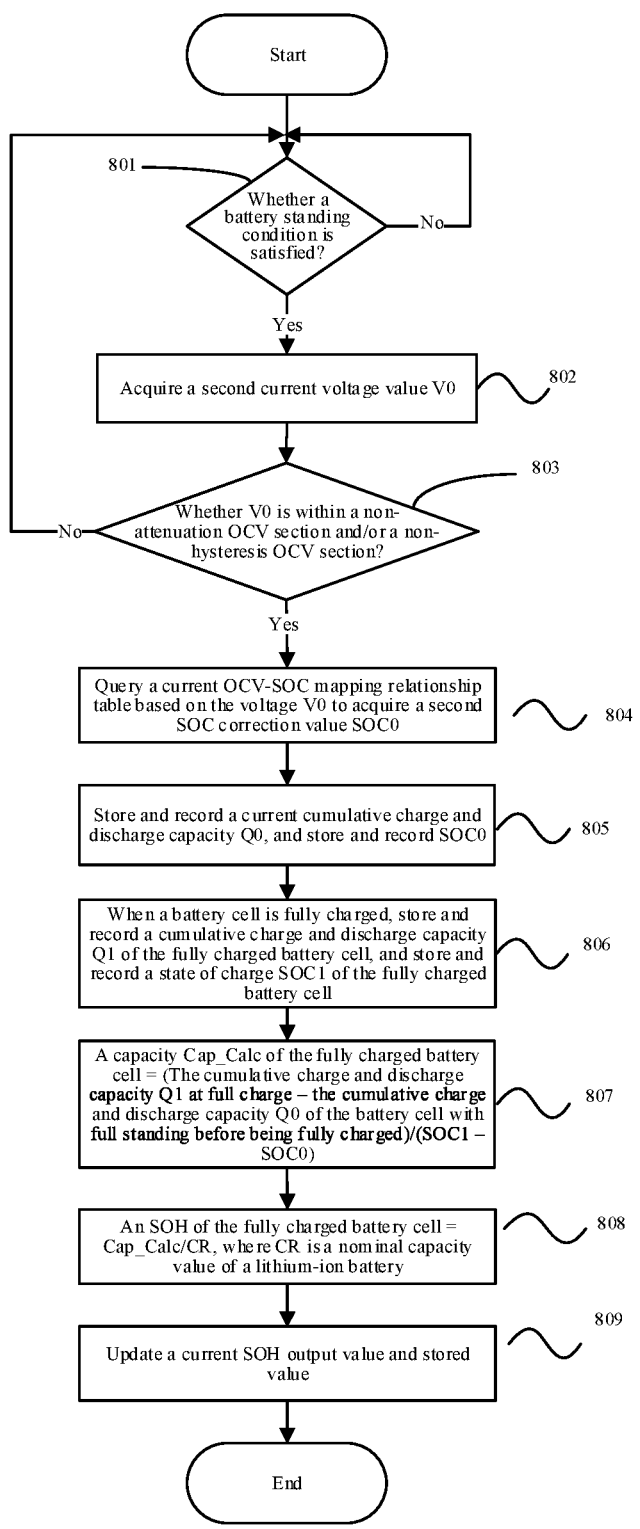
FIG. 8 is a schematic flowchart of acquiring an SOH correction value in still another embodiment of a method for correcting a state of health of a battery according to this disclosure.

FIG. 8 is a schematic flowchart of acquiring an SOH correction value in still another embodiment of a method for correcting a state of health of a battery according to this disclosure. As shown in FIG. 8:

Step 801. Determine whether a battery standing condition is satisfied; and if yes, go to step 802; or if not, go back.

Step 802. Acquire a second current voltage value V0.

Step 803. Determine whether V0 is within a non-attenuation OCV section and/or a non-hysteresis OCV section; and if yes, go to step 804; or if not, go back.

Step 804. Query a current OCV-SOC mapping relationship table based on V0 to acquire a second SOC correction value SOC0. The current OCV-SOC mapping relationship table is fourth OCV-SOC mapping relationship information.

Step 805. Store and record a current cumulative charge and discharge capacity Q0 and SOC0.

Step 806. When a battery cell is fully charged, store and record a cumulative charge and discharge capacity Q1 of the fully charged battery cell, and store and record a state of charge 1 (SOC1) of the fully charged battery cell. The state of charge 1 (SOC1) of the fully charged battery cell may be acquired through an integral operation, or the like, or may be determined through an offline demarcation test.

Step 807. A capacity Cap_Calc of the fully charged battery cell=(the cumulative charge and discharge capacity Q1 at full charge−the cumulative charge and discharge capacity Q0 of the battery cell with full standing before being fully charged)/(SOC1−SOC0). A capacity of the fully charged battery cell is an actual capacity.

Step 808. An SOH of the fully charged battery cell=Cap_Calc/CR, where CR is a nominal capacity value of a lithium-ion battery. Use a ratio of Cap_Calc to the nominal capacity CR as an SOH correction value.

Step 809. Update a current SOH output value and store the value. Verification and determining may be performed on the SOH correction value calculated in step 808, and an SOH value successfully verified is updated to a current SOH value and stored.

Figure 9:
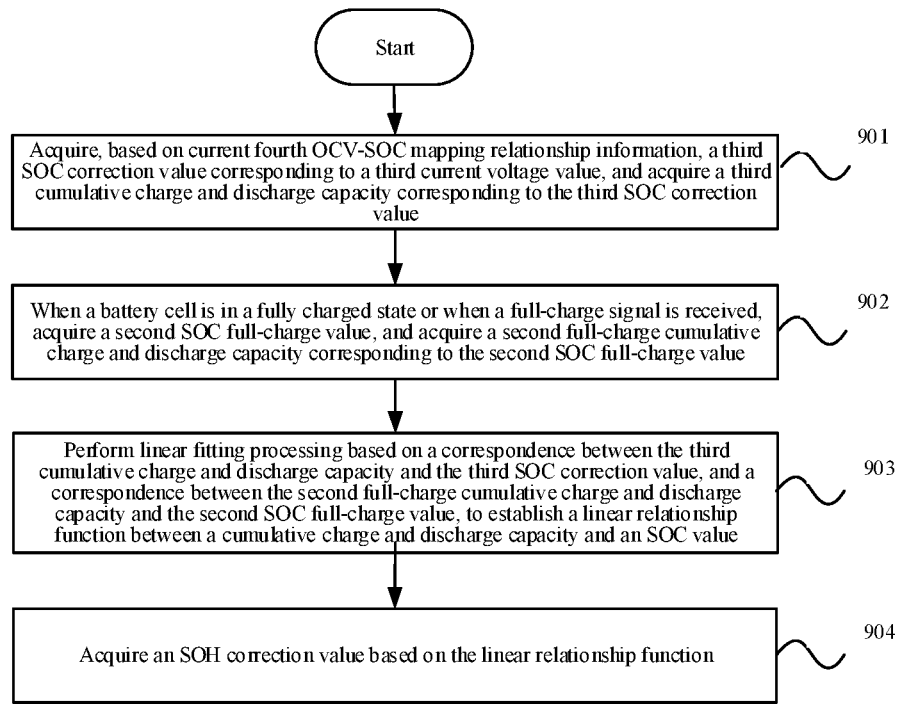
FIG. 9 is a schematic flowchart of acquiring an SOH correction value in yet another embodiment of a method for correcting a state of health of a battery according to this disclosure.

FIG. 9 is a schematic flowchart of acquiring an SOH correction value in yet another embodiment of a method for correcting a state of health of a battery according to this disclosure. A correction voltage value includes a third current voltage value of a battery cell within a non-attenuation OCV section and/or a non-hysteresis OCV section. As shown in FIG. 9:

Step 901. Acquire, based on current fourth OCV-SOC mapping relationship information, a third SOC correction value corresponding to the third current voltage value, and acquire a third cumulative charge and discharge capacity corresponding to the third SOC correction value.

Step 902. When the battery cell is in a fully charged state or when a full-charge signal is received, acquire a second SOC full-charge value, and acquire a second full-charge cumulative charge and discharge capacity corresponding to the second SOC full-charge value.

Step 903. Perform linear fitting processing based on a correspondence between the third cumulative charge and discharge capacity and the third SOC correction value, and a correspondence between the second full-charge cumulative charge and discharge capacity and the second SOC full-charge value, to establish a linear relationship function between a cumulative charge and discharge capacity and an SOC value.

Step 904. Acquire an SOH correction value based on the linear relationship function.

If a sum of a quantity of third SOC correction values and a quantity of second SOC full-charge values is greater than or equal to a preset quantity threshold, the linear fitting processing is performed, where an algorithm used for performing the linear fitting processing includes a least square method, or the like. A fitting error of the linear relationship function is acquired. If it is determined that the fitting error is less than a preset error threshold, a slope corresponding to the linear relationship function is acquired, and the slope is used as the SOH correction value.

For example, a cumulative charge and discharge capacity of the battery cell is recorded in real time, a cumulative charge capacity and a cumulative discharge capacity are recorded, and the cumulative charge and discharge capacity=the cumulative charge capacity−the cumulative discharge capacity. During charging or discharging of the battery cell, it is detected whether the battery standing condition is satisfied or whether a battery string acquires a full-charge signal or satisfies a full-charge determining condition. If the battery standing condition is satisfied, a current voltage value V0 of the battery cell is acquired, and it is determined whether V0 is within the non-attenuation OCV section and/or the non-hysteresis OCV section. If yes, the current voltage value V0 is the third current voltage value. A current OCV-SOC mapping relationship table is queried based on V0 to acquire a third SOC correction value SOC0. A third cumulative charge and discharge capacity Q0 corresponding to the third SOC correction value is acquired, and the third cumulative charge and discharge capacity Q0 and the corresponding third SOC correction value SOC0 are stored.

When a full-charge signal flag for the battery string is set or the battery string satisfies the full charge determining condition, a second full-charge cumulative charge and discharge capacity Qi and a corresponding second SOC full-charge value SOCi are stored and recorded. If a sum of a quantity of third SOC correction values and a quantity of second SOC full-charge values reaches a preset quantity threshold N, N sets of Q (k) and corresponding SOC (k) are stored, where k=1, 2, 3, . . . , and N, Q (k) is the third cumulative charge and discharge capacity or the second full-charge cumulative charge and discharge capacity, and SOC (k) is the third SOC correction value or the second SOC full-charge value.

A quantity k of SOH correction opportunities exceeds a preset quantity N of required points. For example, when N sets of Q (k) and corresponding SOC (k) are stored, where k=1, 2, 3, . . . , and N, a new Q value and a corresponding SOC value are acquired, where Q is a new third cumulative charge and discharge capacity or second full-charge cumulative charge and discharge capacity, and SOC is a new third SOC correction value or second SOC full-charge value. In this case, Q and a corresponding SOC value that are originally stored are removed, and the new Q value and the corresponding SOC value are stored.

There may be a plurality of removal methods. For example, Q (k) and a corresponding SOC (k) that are stored earliest are removed; or an absolute value of a difference between stored SOC (i) and SOC values of remaining N−1 points is determined, and one of two points that are in N points and at which SOCs are closest is removed. For example, if N is 5 and stored SOC values are 10%, 11%, 15%, 30%, and 50%, a difference between every two values is acquired through comparison, and it is learned that points corresponding to 10% and 11% are closest. Therefore, 11% or 10% is discarded, and a new Q value and a corresponding SOC value are stored.

The stored N sets of Q (k) and corresponding SOC (k) may constitute an N-dimensional vector y=[Q (1), Q (2), . . . , Q (N)] and a vector x=[SOC (1), SOC (2), SOC (N)] respectively. A linear formula y=k*x+b is established through fitting by using a least square method or another fitting method, where k and b are undetermined parameters. The undetermined parameters k and b of the linear formula and a fitting error ErrorValue are acquired.

When the fitting error ErrorValue is less than a preset error threshold C, a calculated slope k is the SOH correction value. Verification and determining may be performed on the calculated SOH correction value, and an SOH value successfully verified is updated to a current SOH value and stored.

Figure 10:
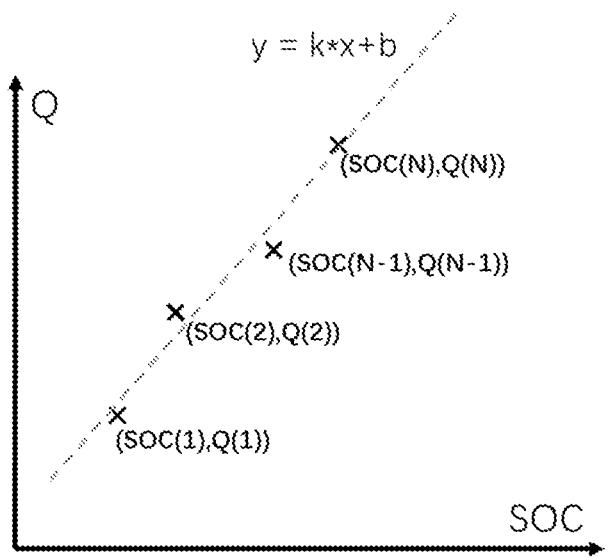
FIG. 10 is a schematic diagram of a linear relationship function generated through fitting in yet another embodiment of a method for correcting a state of health of a battery according to this disclosure.

For example, the stored N sets of Q (k) and corresponding SOC (k) are [SOC (1), Q (1)], [SOC (2), Q (2)], . . . , [SOC (N−1), Q (N−1)], and [SOC (N), Q (N)]. As shown in FIG. 10, SOC (i) is used as input, Q (i) is used as output, and N points are linearly fit by using a method such as a least square method, a neural network method, or a recursive least square method, to acquire parameter values k and b of a linear regression function y=kx+b. When a fitting error is less than a preset value, a slope k is used as the SOH correction value.

The fitting error is an absolute difference or a variance that is between an actual y value and a y value (denoted as y_est) estimated through linear regression and that is acquired by using same input x and a fitting function y=k*x+b, where the fitting function is acquired through linear regression. For example, if estimated y_est is 100 Ah, 108 Ah, and 120 Ah, and actual y values are 99 Ah, 109 Ah, and 120 Ah, the fitting error $$ErrorValue = 1/3 * (|100 - 99| + |108 - 109| + |120 - 120|),$$

$$\text{or } \sqrt{1/3 * (|100 - 99|^2 + |108 - 109|^2 + |120 - 120|^2)}.$$

When the fitting error ErrorValue is greater than the preset error threshold C, correction is canceled.

Figure 11:
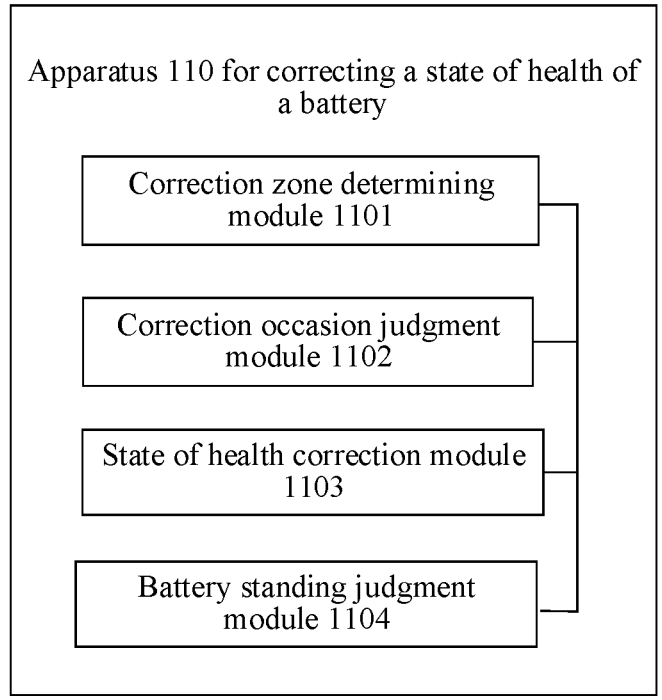
FIG. 11 is a schematic modular diagram of an embodiment of an apparatus for correcting a state of health of a battery according to this disclosure.

In an embodiment, as shown in FIG. 11, this disclosure provides an apparatus 110 for correcting a state of health of a battery, including: a correction zone determining module 1101, a correction occasion judgment module 1102, a state of health correction module 1103, and a battery standing judgment module 1104. The correction zone determining module 1101 is configured to determine a correction OCV section of a battery cell based on open-circuit voltage (OCV)-state of charge (SOC) mapping relationship information of the battery cell. The correction OCV section includes at least one of a non-attenuation OCV section and a non-hysteresis OCV section.

The correction zone determining module 1101 determines, based on the OCV-SOC mapping relationship information, an OCV value corresponding to a correction zone of the battery cell, where the correction zone includes at least one of a non-attenuation zone and a non-hysteresis zone; and The correction zone determining module 1101 generates, based on the OCV value, a correction OCV section corresponding to the correction zone.

The correction occasion judgment module 1102 determines whether a current voltage value of the battery cell is within the correction OCV section of the battery cell. If the current voltage value of the battery cell is within the correction OCV section, the state of health correction module 1103 acquires a correction voltage value, corrects a state of health (SOH) of the battery cell.

In an embodiment, the battery standing judgment module 1104 determines whether a battery standing condition is satisfied; and if yes, the correction occasion judgment module 1102 determines whether the current voltage value of the battery cell is within the correction OCV section. The battery standing condition includes at least one of the following: duration in which an external circuit of the battery cell has no current or a current in the external circuit is less than a current threshold exceeds a preset time threshold, and a voltage change rate of the battery cell is less than a preset rate change threshold.

Figure 12:
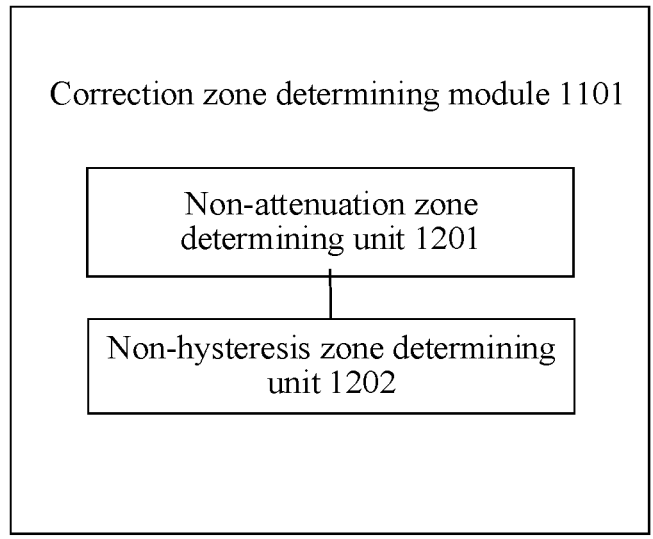
FIG. 12 is a schematic modular diagram of a correction zone determining module in an embodiment of an apparatus for correcting a state of health of a battery according to this disclosure.

In an embodiment, as shown in FIG. 12, the correction zone determining module 1101 includes a non-attenuation zone determining unit 1201 and a non-hysteresis zone determining unit 1202. The non-attenuation zone determining unit 1201 pre-acquires a plurality of pieces of first OCV-SOC mapping relationship information of a battery cell at different degrees of aging, to determine a first OCV value interval. The non-attenuation zone determining unit 1201 acquires first OCV detection values within the first OCV value interval by using a preset first OCV gap as a spacing.

The non-attenuation zone determining unit 1201 acquires, based on the plurality of pieces of first OCV-SOC mapping relationship information, a plurality of first SOC values corresponding to the first OCV detection values, and if a difference between a largest value and a smallest value of the plurality of first SOC values is less than a first difference threshold, uses the first OCV detection values as non-attenuation OCV values corresponding to the non-attenuation zone.

The non-attenuation zone determining unit 1201 determines whether a difference between two adjacent non-attenuation OCV values is greater than the first OCV gap, and if not, using an OCV zone between the two adjacent non-attenuation OCV values as a non-attenuation OCV segment. The non-attenuation OCV section includes at least one non-attenuation OCV segment The non-hysteresis zone determining unit 1202 pre-acquires at least one piece of second OCV-SOC mapping relationship information for charging of the battery cell starting at different states of charge, and at least one piece of third OCV-SOC mapping relationship information for discharging of the battery cell starting at different states of charge, and determines a second OCV value interval. The non-hysteresis zone determining unit 1202 acquires second OCV detection values within the second OCV value interval by using a preset second OCV gap as a spacing.

The non-hysteresis zone determining unit 1202 acquires, based on the at least one piece of second OCV-SOC mapping relationship information and the at least one piece of third OCV-SOC mapping relationship information, a plurality of second SOC values corresponding to the second OCV detection values. If a difference between a largest value and a smallest value of the plurality of second SOC values is less than a second difference threshold, the non-hysteresis zone determining unit 1202 uses the second OCV detection values as non-hysteresis OCV values corresponding to the non-hysteresis zone.

The non-hysteresis zone determining unit 1202 determines whether a difference between two adjacent non-hysteresis OCV values is greater than the second OCV gap, and if not, uses an OCV zone between the two adjacent non-hysteresis OCV values as a non-hysteresis voltage segment. The non-hysteresis OCV section includes at least one non-hysteresis voltage segment.

Figure 13:
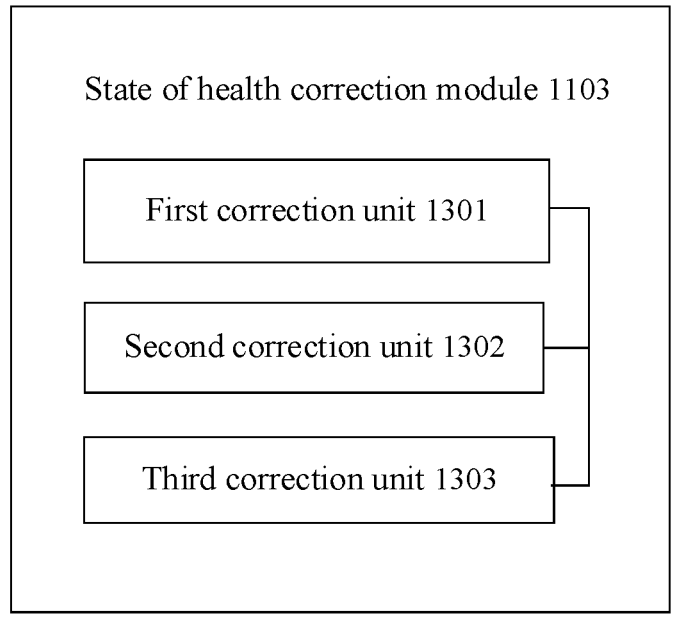
FIG. 13 is a schematic modular diagram of a state of health correction module in an embodiment of an apparatus for correcting a state of health of a battery according to this disclosure.

In an embodiment, as shown in FIG. 13, the state of health correction module 1103 includes a first correction unit 1301, a second correction unit 1302, and a third correction unit 1303. The correction voltage value includes at least two first current voltage values of the battery cell within the non-attenuation OCV section and/or the non-hysteresis OCV section.

The first correction unit 1301 acquires, based on current fourth OCV-SOC mapping relationship information, a first SOC correction value corresponding to a first current voltage value. The first correction unit 1301 acquires a first SOC variation between two first SOC correction values, and a first cumulative charge and discharge capacity variation of the battery cell that corresponds to the first SOC variation. The first correction unit 1301 acquires an SOH correction value based on the first cumulative charge and discharge capacity variation and the first SOC variation.

The first correction unit 1301 uses a ratio of the first cumulative charge and discharge capacity variation to the first SOC variation as an actual capacity of the battery cell, and uses a ratio of the actual capacity to a nominal capacity as the SOH correction value.

In an embodiment, the correction voltage value includes a second current voltage value of the battery cell within the non-attenuation OCV section and/or the non-hysteresis OCV section. The second correction unit 1302 acquires, based on current fourth OCV-SOC mapping relationship information, a second SOC correction value corresponding to the second current voltage value. When the battery cell is in a fully charged state or when a full-charge signal is received, the second correction unit 1302 acquires a first SOC full-charge value, and acquires a first full-charge cumulative charge and discharge capacity corresponding to the first SOC full-charge value. The second correction unit 1302 acquires a second SOC variation between the first SOC full-charge value and the second SOC correction value, and a second cumulative charge and discharge capacity variation between the first full-charge cumulative charge and discharge capacity and a second cumulative charge and discharge capacity. The second correction unit 1302 acquires an SOH correction value based on the second cumulative charge and discharge capacity variation and the second SOC variation.

The second correction unit 1302 uses a ratio of the second cumulative charge and discharge capacity variation to the second SOC variation as an actual capacity of the battery cell, and uses a ratio of the actual capacity to a nominal capacity as the SOH correction value.

Before the battery cell is in the fully charged state or before the full-charge signal is received, if a plurality of second current voltage values are acquired, the second correction unit 1302 acquires, based on the fourth OCV-SOC mapping relationship information, a plurality of SOC correction values corresponding to the plurality of second current voltage values. The second correction unit 1302 uses a correction voltage value corresponding to a smallest SOC correction value in the plurality of SOC correction values as the second SOC correction value.

In an embodiment, the correction voltage value includes a third current voltage value of the battery cell within the non-attenuation OCV section and/or the non-hysteresis OCV section. The third correction unit 1303 acquires, based on current fourth OCV-SOC mapping relationship information, a third SOC correction value corresponding to the third current voltage value, and acquires a third cumulative charge and discharge capacity corresponding to the third SOC correction value.

When the battery cell is in a fully charged state or when a full-charge signal is received, the third correction unit 1303 acquires a second SOC full-charge value, and acquires a second full-charge cumulative charge and discharge capacity corresponding to the second SOC full-charge value. The third correction unit 1303 performs linear fitting processing based on a correspondence between the third cumulative charge and discharge capacity and the third SOC correction value, and a correspondence between the second full-charge cumulative charge and discharge capacity and the second SOC full-charge value, to establish a linear relationship function between a cumulative charge and discharge capacity and an SOC value; and acquires an SOH correction value based on the linear relationship function.

If a sum of a quantity of third SOC correction values and a quantity of second SOC full-charge values is greater than or equal to a preset quantity threshold, the third correction unit 1303 performs the linear fitting processing, where an algorithm used for performing the linear fitting processing includes a least square method, or the like. The third correction unit 1303 acquires a fitting error of the linear relationship function; and if it is determined that the fitting error is less than a preset error threshold, acquires a slope corresponding to the linear relationship function, and uses the slope as the SOH correction value.

Figure 14:
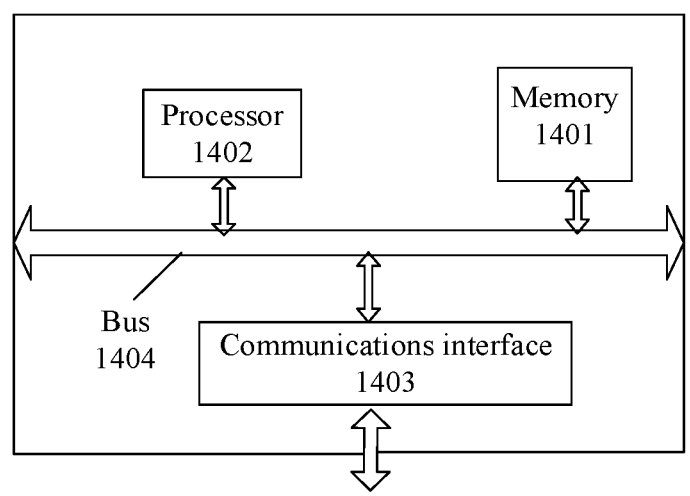
FIG. 14 is a schematic modular diagram of another embodiment of an apparatus for correcting a state of health of a battery according to this disclosure.

FIG. 14 is a schematic modular diagram of another embodiment of an apparatus 140 for correcting a state of health of a battery according to this disclosure. As shown in FIG. 14, the apparatus may include a memory 1401, a processor 1402, a communications interface 1403, and a bus 1404. The memory 1401 is configured to store an instruction. The processor 1402 is coupled to the memory 1401. The processor 1402 is configured to perform, according to the instruction stored in the memory 1401, the foregoing method for correcting a state of health of a battery.

The memory 1401 may be a high-speed RAM memory, a non-volatile memory (non-volatile memory), or the like; or the memory 1401 may be a memory array. The memory 1401 may be alternatively divided into blocks, and the blocks may be combined into a virtual volume according to a specific rule. The processor 1402 may be a central processing unit CPU, or an application-specific integrated circuit ASIC (Application Specific Integrated Circuit), or one or more integrated circuits that are configured to implement the method for correcting a state of health of a battery in this disclosure.

In an embodiment, this disclosure provides a battery management system, including the apparatus for correcting a state of health of a battery in any one of the foregoing embodiments. The battery management system may be installed on an automobile or the like, and can manage a battery.

In an embodiment, this disclosure provides a computer readable storage medium. The computer readable storage medium stores a computer instruction. When the instruction is executed by a processor, the method for correcting a state of health of a battery in any one of the foregoing embodiments is implemented.

According to the method and the apparatus for correcting a state of health of a battery, the battery management system, and the storage medium in the foregoing embodiments, the correction OCV section including the non-attenuation OCV section and the non-hysteresis OCV section is determined; if the current voltage value of the battery cell is within the correction OCV section, the current voltage value is used as the correction voltage value; the SOC correction value is acquired, and the SOH is corrected by using the SOC correction value. For phenomena of battery aging and a hysteresis effect of battery charging and discharging, when a voltage value of the battery cell is within the correction OCV section, different OCV-SOC curves change essentially the same, and an SOC is acquired and an SOH is corrected essentially free from impact of a hysteresis effect or impact of an aging change of the battery. When the battery cell is within a non-hysteresis zone or a non-attenuation zone, an SOC can be acquired, and an SOH can be corrected. This could overcome a problem of low accuracy in acquiring an SOC and correcting an SOH under battery aging and a hysteresis effect of battery charging and discharging, thereby improving reliability of an SOH correction result, allowing accurate estimation of the state of health of the battery, a prolonged service life of the battery and better user experience.

The method and the system in this disclosure may be implemented in many ways. For example, the method and the system in this disclosure may be implemented by software, hardware, firmware, or any combination of software, hardware, and firmware. The foregoing sequence of the steps of the method is merely intended for illustration, and the steps of the method in this disclosure are not limited to the sequence in the foregoing specific description, unless otherwise specified. In addition, in some embodiments, this disclosure may be alternatively implemented as programs recorded in a recording medium, and the programs include machine readable instructions for implementing the method according to this disclosure. Therefore, this disclosure further covers the recording medium that stores the programs for performing the method in this disclosure.

The descriptions of this disclosure are given for the sake of examples and illustration, and are not exhaustive or limiting this disclosure to the disclosed forms. Many modifications and changes are apparent to a person of ordinary skill in the art. The embodiments are selected and described to better explain the principles and the practical application of this disclosure, so that a person of ordinary skill in the art can understand this disclosure and design various embodiments with various modifications for specific uses.

What is claimed is:

1. A method for correcting a state of health (SOH) of a battery cell, performed at an apparatus that is communicatively connected to the battery cell and including a processor and memory, the method comprising:

establishing a connection between the apparatus and the battery cell through a communications interface of the apparatus;

acquiring, via the connection between the apparatus and the battery cell, a first current voltage value V0 of a battery cell;

when V0 is within a correction open-circuit voltage (OCV) section of the battery cell, acquiring, via the connection between the apparatus and the battery cell, a first state of charge (SOC) SOC0 and a first cumulative charge and discharge capacity Q0 corresponding to V0, wherein the correction OCV section comprises at least one of a non-attenuation OCV section and a non-hysteresis OCV section, an OCV of the battery cell is unaffected by battery aging in the non-attenuation OCV section, and an OCV of the battery cell is unaffected by a hysteresis effect in the non-hysteresis OCV section;

acquiring, via the connection between the apparatus and the battery cell, a second current voltage value V1 of the battery cell;

when V1 is within the correction OCV section of the battery cell, acquiring, via the connection between the apparatus and the battery cell, a second state of charge SOC1 and a second cumulative charge and discharge capacity Q1 corresponding to V1;

acquiring, via the connection between the apparatus and the battery cell, a current SOH correction value of the battery cell based on a ratio of a variation between Q0 and Q1 to a variation between SOC0 and SOC1; and updating a SOH output value of the battery cell by using the current SOH correction value of the battery cell.

2. The method according to claim 1, wherein the acquiring a current SOH correction value of the battery cell based on a ratio of a variation between Q0 and Q1 to a variation between SOC0 and SOC1 comprises:

acquiring an actual capacity of the battery cell based on the ratio of the variation between Q0 and Q1 to the variation between SOC0 and SOC1; and acquiring the current SOH correction value of the battery cell based on the actual capacity of the battery cell and a nominal capacity of the battery cell.

3. The method according to claim 1, wherein the acquiring a first current voltage value V0 of a battery cell comprises:

acquiring the first current voltage value V0 of the battery cell when a battery standing condition is satisfied; and the acquiring a second current voltage value V1 of the battery cell comprises:

acquiring the second current voltage value V1 of the battery cell when the battery standing condition is satisfied.

4. The method according to claim 3, wherein the battery standing condition comprises at least one of: a duration in which an external circuit of the battery cell has no current or a current in the external circuit of the battery cell is less than a current threshold exceeds a preset time threshold, and a voltage change rate of the battery cell is less than a preset rate change threshold.

5. The method according to claim 1, wherein the updating a SOH output value of the battery cell by using the current SOH correction value of the battery cell comprises:

updating the SOH output value of the battery cell by using the current SOH correction value of the battery cell when the current SOH correction value of the battery cell is less than a previous SOH correction value of the battery cell.

6. The method according to claim 5, wherein the updating an SOH output value of the battery cell by using the current SOH correction value of the battery cell comprises:

updating the SOH output value of the battery cell by using the current SOH correction value of the battery cell according to an update rule, wherein the update rule comprises: a variation between the current SOH correction value of the battery cell and the previous SOH correction value of the battery cell is not greater than a maximum SOH update value for a single update.

7. The method according to claim 1, wherein when the second current voltage value V1 is a full-charge voltage value of the battery cell, the acquiring a second state of charge SOC1 and a second cumulative charge and discharge capacity Q1 that are corresponding to V1 comprises:

acquiring a full-charge SOC1 of the battery cell and a full-charge cumulative charge and discharge capacity Q1 of the battery cell.

8. An apparatus for correcting a state of health (SOH) of a battery, the apparatus comprising:

a memory;

a processor;

a communications interface; and a plurality of instructions stored in the memory that, when executed by the processor, cause the apparatus to:

establish a connection between the apparatus and the battery cell through the communications interface of the apparatus;

acquire, via the connection between the apparatus and the battery cell, a first current voltage value V0 of a battery cell;

when V0 is within a correction open-circuit voltage (OCV) section of the battery cell, acquire, via the connection between the apparatus and the battery cell, a first state of charge (SOC) SOC0 and a first cumulative charge and discharge capacity Q0 corresponding to V0, wherein the correction OCV section comprises at least one of a non-attenuation OCV section and a non-hysteresis OCV section, an OCV of the battery cell is unaffected by battery aging in the non-attenuation OCV section, and an OCV of the battery cell is unaffected by a hysteresis effect in the non-hysteresis OCV section;

acquire, via the connection between the apparatus and the battery cell, a second current voltage value V1 of the battery cell;

when V1 is within the correction OCV section of the battery cell, acquire, via the connection between the apparatus and the battery cell, a second state of charge SOC1 and a second cumulative charge and discharge capacity Q1 corresponding to V1;

acquire, via the connection between the apparatus and the battery cell, a current SOH correction value of the battery cell based on a ratio of a variation between Q0 and Q1 to a variation between SOC0 and SOC1; and update a SOH output value of the battery cell by using the current SOH correction value of the battery cell.

9. The apparatus according to claim 8, wherein the apparatus is configured to:

acquire an actual capacity of the battery cell based on the ratio of the variation between Q0 and Q1 to the variation between SOC0 and SOC1; and acquire the current SOH correction value of the battery cell based on the actual capacity of the battery cell and a nominal capacity of the battery cell.

10. The apparatus according to claim 8, wherein the apparatus is configured to:

determine whether a battery standing condition is satisfied; and when the battery standing condition is satisfied, determine whether the first current voltage value V0 of the battery cell and the second current voltage value V1 of the battery cell are within the correction OCV section of the battery cell.

11. The apparatus according to claim 10, wherein the battery standing condition comprises at least one of: duration in which an external circuit of the battery cell has no current or a current in the external circuit of the battery cell is less than a current threshold exceeds a preset time threshold, and a voltage change rate of the battery cell is less than a preset rate change threshold.

12. The apparatus according to claim 8, wherein the apparatus is configured to:

update the SOH output value of the battery cell by using the current SOH correction value of the battery cell when the current SOH correction value of the battery cell is less than a previous SOH correction value of the battery cell.

13. The apparatus according to claim 12, wherein the apparatus is configured to:

update the SOH output value of the battery cell by using the current SOH correction value of the battery cell according to an update rule, wherein the update rule comprises: a variation between the current SOH correction value of the battery cell and the previous SOH correction value of the battery cell is not greater than a maximum SOH update value for a single update.

14. The apparatus according to claim 8, wherein the apparatus is configured to:

when the second current voltage value V1 is a full-charge voltage value of the battery cell, acquire a full-charge SOC1 of the battery cell and a full-charge cumulative charge and discharge capacity Q1 of the battery cell.

* * * * *